United States Patent
Liu et al.

(10) Patent No.: US 8,193,625 B2
(45) Date of Patent: Jun. 5, 2012

(54) STACKED-CHIP PACKAGING STRUCTURE AND FABRICATION METHOD THEREOF

(75) Inventors: Chun-Kai Liu, Taipei (TW); Chih-Kuang Yu, Chiayi (TW); Ming-Ji Dai, Chiayi County (TW); Ming-Che Hsieh, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 203 days.

(21) Appl. No.: 12/583,725

(22) Filed: Aug. 24, 2009

(65) Prior Publication Data

US 2010/0290193 A1 Nov. 18, 2010

(30) Foreign Application Priority Data

May 15, 2009 (TW) .............................. 98116156 A

(51) Int. Cl.
*H01L 23/02* (2006.01)

(52) U.S. Cl. .. 257/686; 257/687; 257/706; 257/E23.021

(58) Field of Classification Search .......... 257/678–688, 257/706, 737–738, E23.021
See application file for complete search history.

(56) References Cited

U.S. PATENT DOCUMENTS

| | | | |
|---|---|---|---|
| 6,525,943 B2 | 2/2003 | Moden et al. | |
| 6,566,746 B2 | 5/2003 | Isaak et al. | |
| 6,700,783 B1* | 3/2004 | Liu et al. | 361/704 |
| 6,878,571 B2 | 4/2005 | Isaak et al. | |
| 7,119,428 B2 | 10/2006 | Tanie et al. | |
| 2004/0115867 A1* | 6/2004 | Shibata | 438/125 |
| 2007/0232026 A1 | 10/2007 | Apanius et al. | |
| 2007/0235215 A1* | 10/2007 | Bathan et al. | 174/260 |
| 2007/0290338 A1* | 12/2007 | Kuczynski | 257/737 |

* cited by examiner

*Primary Examiner* — H. Jey Tsai
(74) *Attorney, Agent, or Firm* — J.C. Patents

(57) ABSTRACT

A stacked-chip packaging structure includes chip sets, a heat sink, a substrate, a circuit board, and solder balls. The chip sets are stacked together, each of which has a heat-dissipation structure and a chip. The heat-dissipation structure has a chip recess, through holes arranged in the chip recess, and an extending portion extending from the chip recess. The chip disposed in the chip recess has bumps. Each bump on the chip is correspondingly disposed in one of the through holes of the heat-dissipation structure. The extending portion of the heat-dissipation structure of each chip set contacts that of the neighboring chip set. The heat sink and the substrate are disposed at two opposite sides of the chip sets, respectively. The circuit board is below the substrate. The solder balls are between the circuit board and the substrate.

9 Claims, 12 Drawing Sheets

(2 of 12 Drawing Sheet(s) Filed in Color)

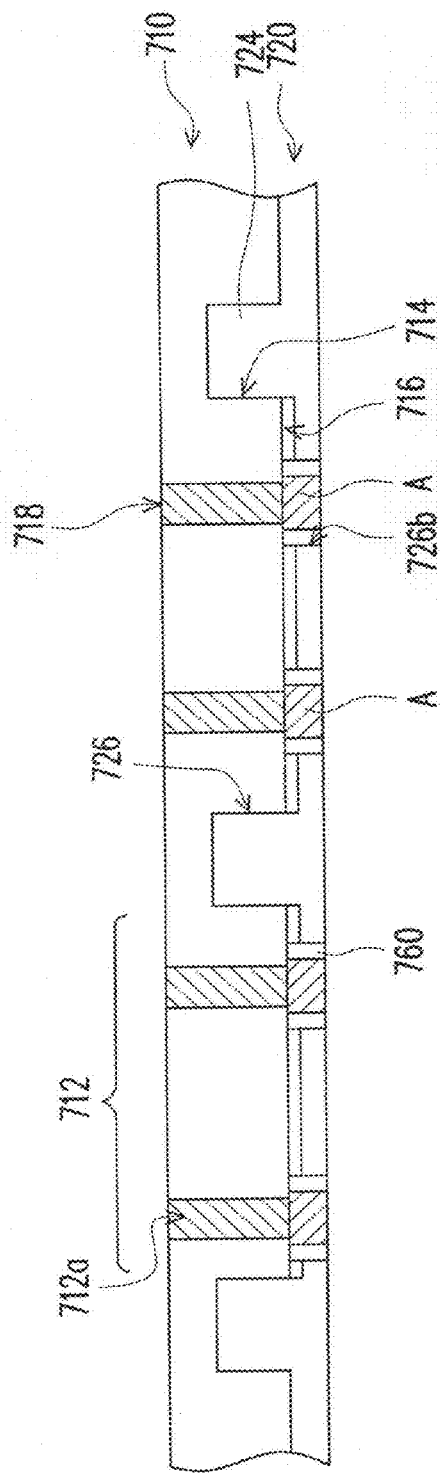
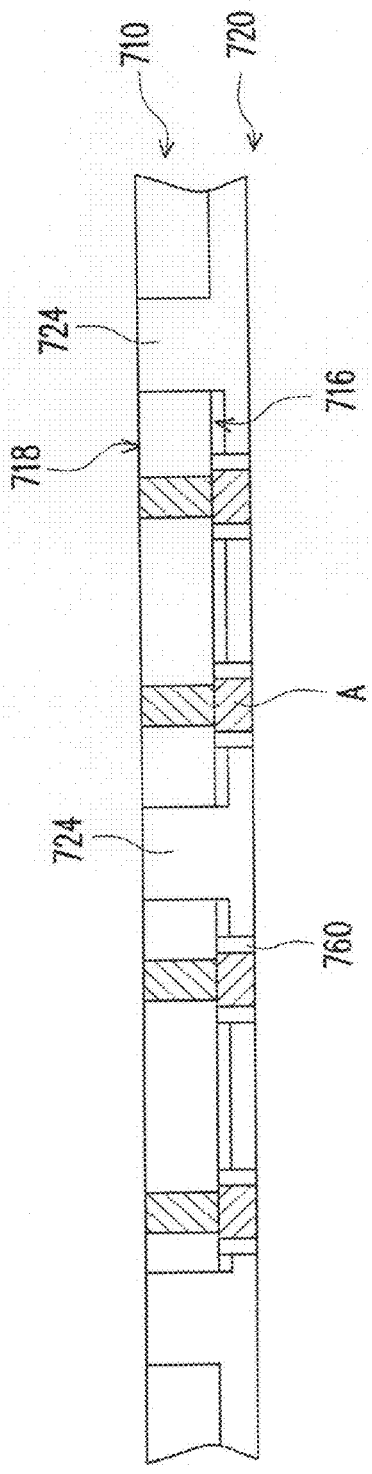
FIG. 7B
FIG. 7C

STACKED-CHIP PACKAGING STRUCTURE AND FABRICATION METHOD THEREOF

CROSS-REFERENCE TO RELATED APPLICATION

This application claims the priority benefit of Taiwan application serial no. 98116156, filed on May 15, 2009. The entirety of the above-mentioned patent application is hereby incorporated by reference herein and made a part of this specification.

BACKGROUND

1. Technical Field

The disclosure relates to a stacked-chip packaging structure and a fabrication method thereof.

2. Description of Related Art

In modern information era, consumers continuously pursue electronic products with high speed, outstanding quality, and multiple functions. The design of exterior appearances of the electronic products reveals a trend of light weight, thinness, small size, and compactness. In order to comply with the aforementioned trend, a multi-chip packaging module has been developed recently. In the multi-chip packaging module, a plurality of chips with identical or different functions are packaged together on a carrier. The carrier is a substrate or a lead frame, for example, and the carrier is electrically connected to external circuits through the carrier. Therefore, the multi-chip packaging module has a fast transmission speed, a short transmission path, and favorable electric characteristics, and a size of the multi-chip packaging structure and an area occupied thereby are further reduced. As a result, the multi-chip packaging technology has been extensively applied in a variety of electronic products and become the mainstream of future market.

In a stacked-chip packaging structure, the multi-chip packaging technology is adopted to stack a plurality of chips or a plurality of passive devices on the same carrier. FIG. 1A is a conventional cross-sectional view illustrating a stacked-chip packaging structure in which chips are connected by through holes and bumps. FIG. 1B is a diagram illustrating surface temperature distribution of the stacked-chip packaging structure shown in FIG. 1A. Referring to FIGS. 1A and 1B, conventionally, a plurality of chips 110 are stacked together and disposed on a substrate 120. The chips 110 can be electrically connected to one another through a plurality of through holes 140 and bumps 130 disposed among the chips 110.

Nonetheless, when heat is generated on certain area on the chips 110 during operation of the chips 110, the heat is mostly dissipated laterally through the chips 110. By contrast, it is relatively difficult to dissipate heat vertically through air and the bumps 130 among the chips 110, which results in large thermal resistance. Thereby, hot spots with high temperature are prone to be formed on the chips 110, and the overheated hot spots may cause damages to the chips 110 and generate thermal stresses at the bumps 130. As such, reliability of the stacked-chip packaging structure 100 is deteriorated.

SUMMARY

A stacked-chip packaging structure including a plurality of chip sets, a heat sink, a substrate, a circuit board, and a plurality of solder balls is provided. The chip sets are stacked together, and each of the chip sets has a heat-dissipation structure and a chip. The heat-dissipation structure has a chip recess, a plurality of through holes arranged in the chip recess, and an extending portion extending from the chip recess. The chip has a plurality of bumps formed thereon and is disposed in the chip recess. Each of the bumps on the chip is correspondingly disposed in one of the through holes of the heat-dissipation structure. The extending portion of the heat-dissipation structure of each of the chip sets contacts the extending portion of the heat-dissipation structure of the neighboring chip set. The heat sink is located at a top portion of the chip sets. The substrate is located at a bottom portion of the chips sets. The circuit board is located below the substrate. The solder balls are located between the circuit board and the substrate.

A stacked-chip packaging structure including a first chip set, at least one second chip set, a heat sink, a substrate, a bottom heat-dissipation structure, a circuit board, and a plurality of solder balls is provided. The first chip includes a first heat-dissipation structure and a first chip. The first heat-dissipation structure has a first chip recess and a first extending portion extending from the first chip recess. The first chip is disposed in the first chip recess. The at least one second chip set is located below the first chip set. Each second chip set includes a second heat-dissipation structure and at least one second chip. The second heat-dissipation structure has a second chip recess, a plurality of through holes arranged in the second chip recess, and a second extending portion extending from the second chip recess. The second chip has a plurality of bumps thereon and is disposed in the second chip recess. Each of the bumps on the at least one second chip is correspondingly disposed in one of the through holes of the second heat-dissipation structure, respectively. The first extending portion of the first heat-dissipation structure contacts the second extending portion of the second heat-dissipation structure of the at least one second chip set adjacent to the first chip set. The heat sink is located at a top portion of the first chip set. The substrate is located at a bottom portion of the at least one second chip set. The bottom heat-dissipation structure is located between the substrate and the at least one second chip set. The circuit board is located below the substrate. The solder balls are located between the circuit board and the substrate.

A method of fabricating a stacked-chip packaging structure is also provided hereinafter. First, a wafer is provided. A plurality of chips, a plurality of through holes, and a plurality of pre-scribed lines disposed alternately are on the wafer. Next, a heat-dissipation structure is provided. The heat-dissipation structure has a main body, a plurality of bar-shaped protrusions disposed alternately, and a plurality of recesses. A plurality of through holes are formed at bottom portions of the recesses. Thereafter, a plurality of bumps are formed on the chips of the wafer. The heat-dissipation structure and the wafer are then assembled together. The bar-shaped protrusions of the heat-dissipation structure are located in the pre-scribed lines on the wafer, and the bumps on the chips are inserted into the through holes of the heat-dissipation structure. Afterward, a polishing process is performed on the wafer to expose the bar-shaped protrusions of the heat-dissipation structure. A cutting process is then performed along the pre-scribed lines to form a plurality of chip sets. Next, the chip sets are stacked together. Thereafter, the stacked chip sets are disposed on a substrate.

In order to make the aforementioned and other features and advantages of the embodiment more comprehensible, several embodiments accompanying figures are described in detail below.

BRIEF DESCRIPTION OF THE DRAWINGS

The patent or application file contains at least one drawing executed in color. Copies of this patent or patent application publication with color drawing(s) will be provided by the United State Patent and Trademark Office upon request and payment of the necessary fee.

The accompanying drawings are included to provide a further understanding of the embodiment and are incorporated in and constitute a part of this specification. The drawings illustrate embodiments and, together with the description, serve to explain the principles of the embodiment.

FIGS. 7A-7E are cross-sectional views illustrating a process of fabricating a stacked-chip packaging structure according to an embodiment.

DESCRIPTION OF EMBODIMENTS

Figure 1A:
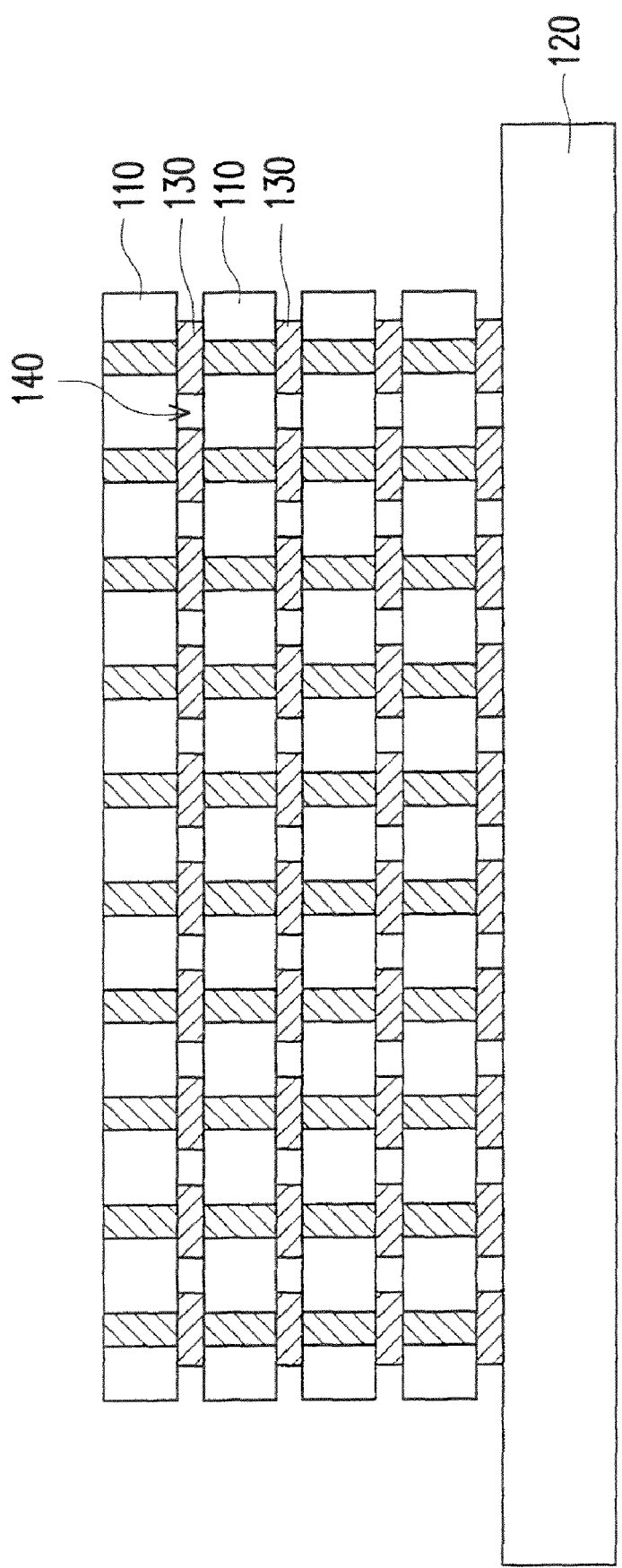
FIG. 1A is a cross-sectional view illustrating a conventional stacked-chip packaging structure.
Figure 1B:
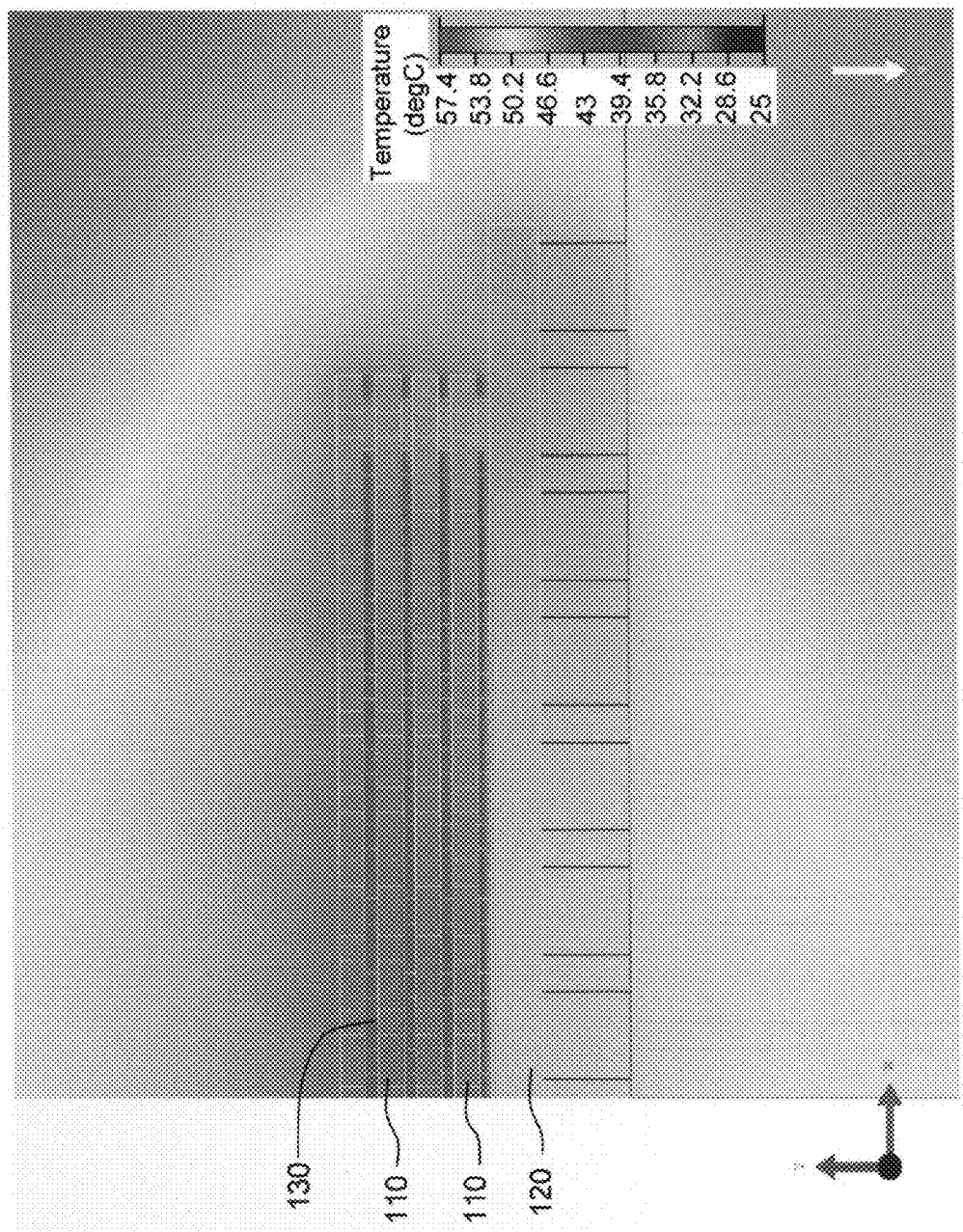
FIG. 1B is a diagram illustrating surface temperature distribution of the stacked-chip packaging structure shown in FIG. 1A.
Figure 2A:
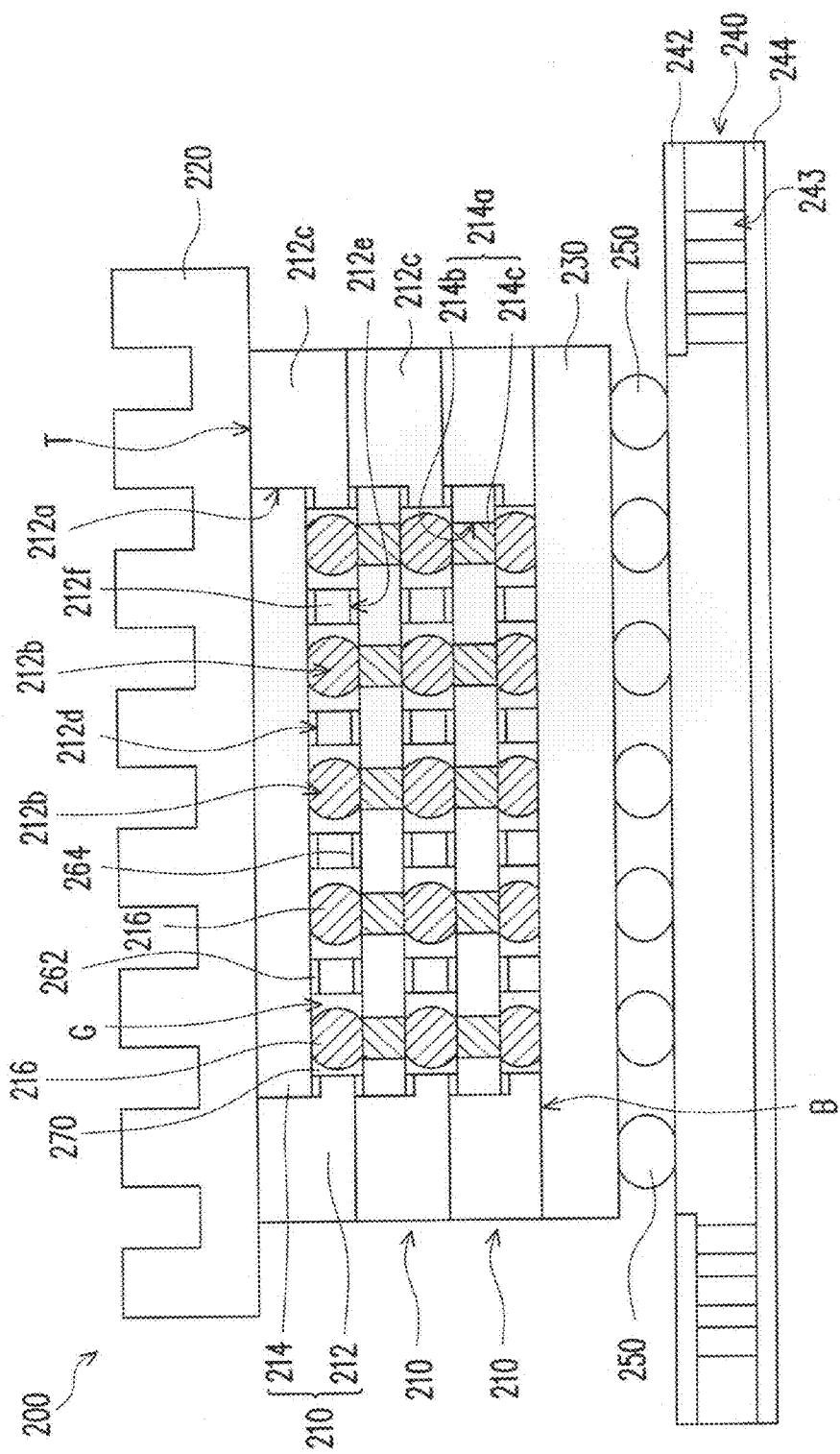
FIG. 2A is a cross-sectional view of a stacked-chip packaging structure according to an embodiment.
Figure 2B:
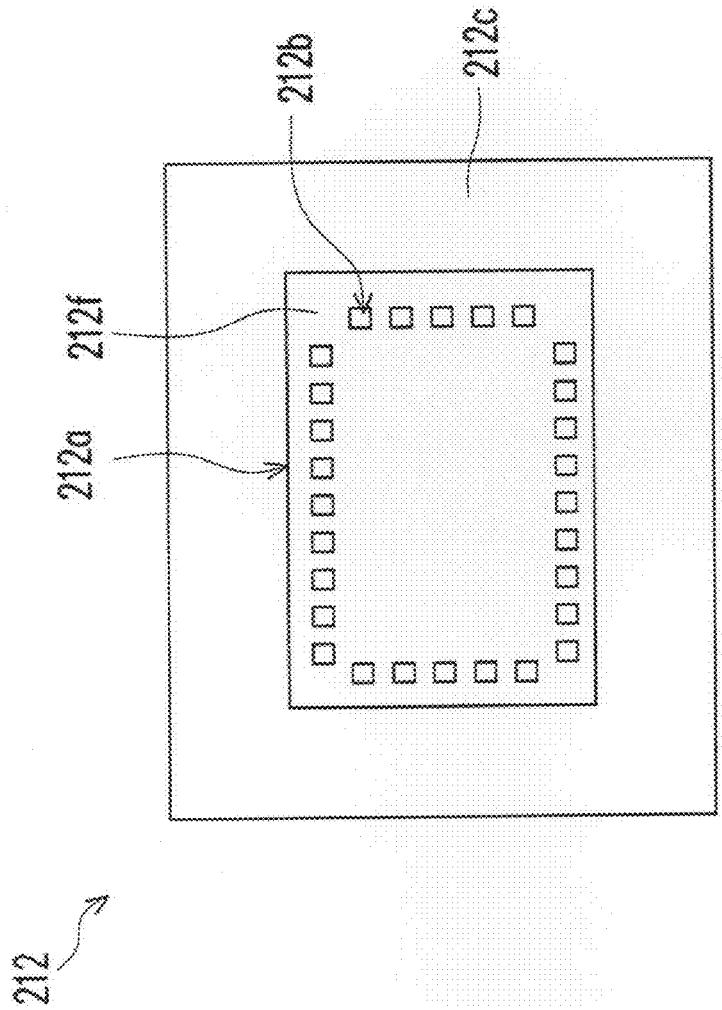
FIG. 2B is a top view of the heat-dissipation structure shown in FIG. 2A.
Figure 3:
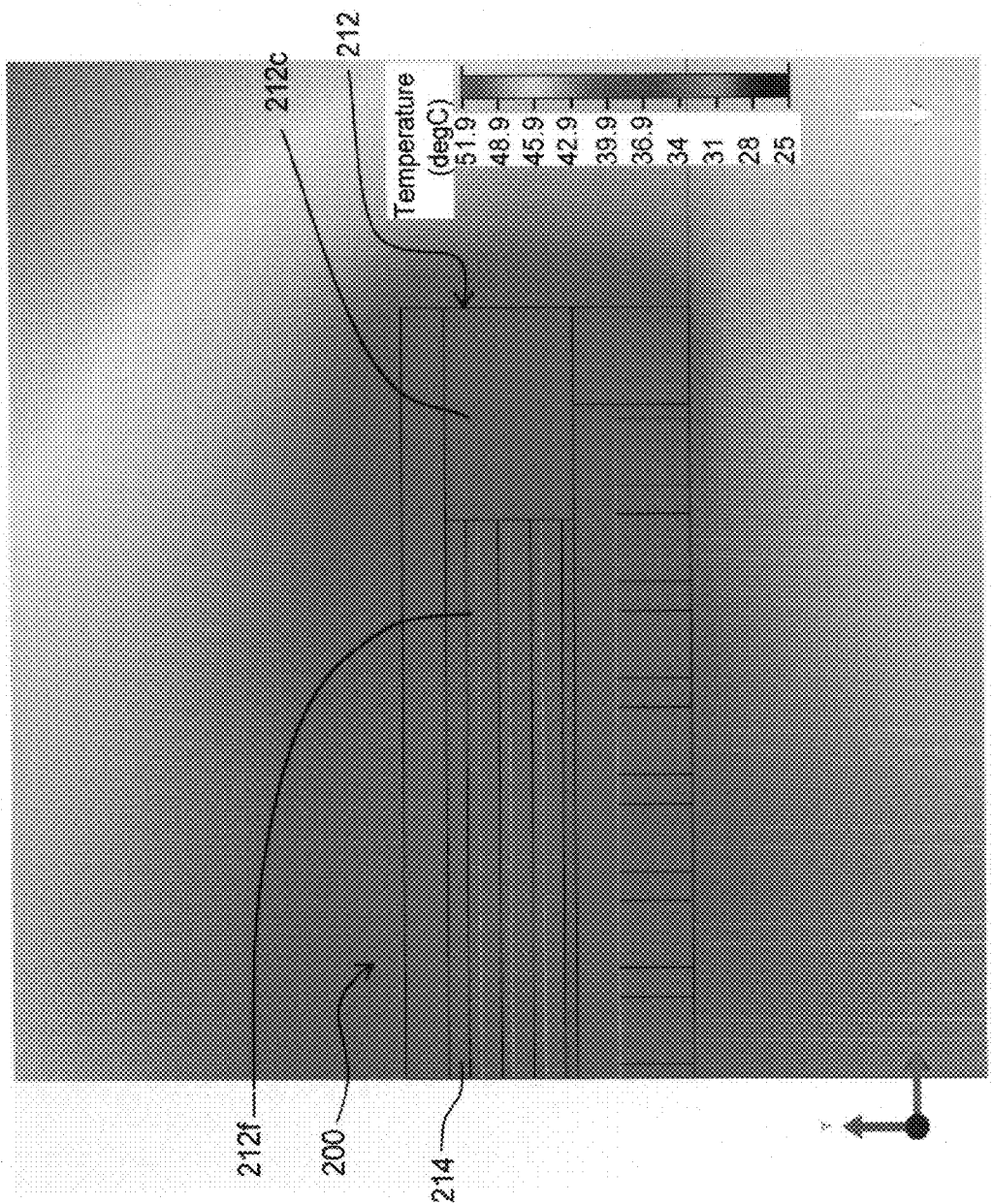
FIG. 3 is a diagram illustrating surface temperature distribution of the stacked-chip packaging structure shown in FIG. 2A.

FIG. 2A is a cross-sectional view of a stacked-chip packaging structure according to an embodiment. FIG. 2B is a top view of the heat-dissipation structure shown in FIG. 2A. FIG. 3 is a diagram illustrating surface temperature distribution of the stacked-chip packaging structure shown in FIG. 2A.

As shown in FIGS. 2A and 2B, the stacked-chip packaging structure 200 of the embodiment includes a plurality of chip sets 210, a heat sink 220, a substrate 230, a circuit board 240, and a plurality of solder balls 250. The chip sets 210 are stacked together, and each of the chip sets 210 includes a heat-dissipation structure 212 and a chip 214.

The heat-dissipation structure 212 has a chip recess 212a, a plurality of through holes 212b arranged in the chip recess 212a, and an extending portion 212c extending from the chip recess 212a. According to the embodiment, for instance, the heat-dissipation structure 212 is made of a ceramic material, a metal material, or a semiconductor material. The ceramic material includes aluminum oxide, aluminum nitride, or silicon carbide. The metal material includes copper or aluminum. The semiconductor material includes silicon. The chip 214 has a plurality of bumps 216 thereon and is disposed in the chip recess 212a. Each of the bumps 216 on the chip 214 is correspondingly disposed in one of the through holes 212b of the heat-dissipation structure 212. In the embodiment, the chip 214 has circuits and devices (not shown) thereon, and the chip 214 can selectively have a plurality of conductive channels 214a composed of vent holes 214b formed in the chip 214 and conductive materials 214c filling the vent holes 214b. The bumps 216 on the chip 214 can be electrically connected to the conductive channels 214a, and the chip sets 210 can be electrically connected together through the bumps 216 and the conductive channels 214a. In the embodiment, the chip recess 212a has an upward design, and therefore each of the chips 214 is disposed in the chip recess 212a before the chips 214 are stacked together. Thereby, each heat-dissipation structure 212 in which the chip 214 is installed can be directly stacked together.

According to the embodiment, an adhesion layer 262 and an adhesion layer 264 can be respectively disposed on two opposite surfaces 212d and 212e of the heat-dissipation structure 212, so as to bond the heat-dissipation structure 212 to two adjacent chips 214 and to further enhance bonding strength between two chip sets 210 and reliability of the stacked-chip packaging structure 200. The adhesion layers 262 and 264 are respectively located on the upper surface 212d and the lower surface 212e of an interlayer portion 212f. Besides, the adhesion layers 262 and 264 can be further disposed on a surface of the extending portion 212c. A material of the adhesion layers 262 and 264 is selected from an adhesion material characterized by high conductivity. On the other hand, in the embodiment, a buffer material 270 can be disposed in the through holes 212b. The buffer material 270 completely fills gaps G between inner walls of the through holes 212b and the bumps 216 to reduce stresses of the bumps 216. The buffer material 270 is, for example, polymer.

The extending portion 212c of the heat-dissipation structure 212 of each of the chip sets 210 contacts the extending portion 212c of the heat-dissipation structure 212 of the neighboring chip set 210. The heat sink 220 is located at a top portion T of the chip sets 210 and is a metal heat-dissipation fin, for example. The substrate 230 is located at a bottom portion B of the chips sets 210. The circuit board 240 is located below the substrate 230. The solder balls 250 are located between the circuit board 240 and the substrate 230 to electrically connect the circuit board 240 and the substrate 230. The circuit board 240 is equipped with elements which are commonly installed on a known circuit board, and the elements include ground pads (or power pads) 242, through holes 243, and a copper foil layer 244.

Note that the heat-dissipation structure 212 not only has the interlayer portion 212f located among the chips 214 but also has the extending portion 212c located around each of the chips 214. Hence, heat generated by the chips 214 not only can be laterally conducted to the extending portion 212c through the interlayer portion 212f but also can be vertically conducted through the extending portion 212c. As such, the heat generated by the chips 214 can be effectively conducted by the heat-dissipation structure 212 to the heat sink 220 above the chip sets 210 and the substrate 230 below the chip sets 210. As indicated in FIG. 3, it can be learned that the temperature distribution of the stacked-chip packaging structure 200 is even when the heat is generated by the chips 214, and no hot spot is formed. Accordingly, the heat-dissipation structure 212 in fact is able to evenly dissipate the heat generated by the chips 214.

Figure 4:
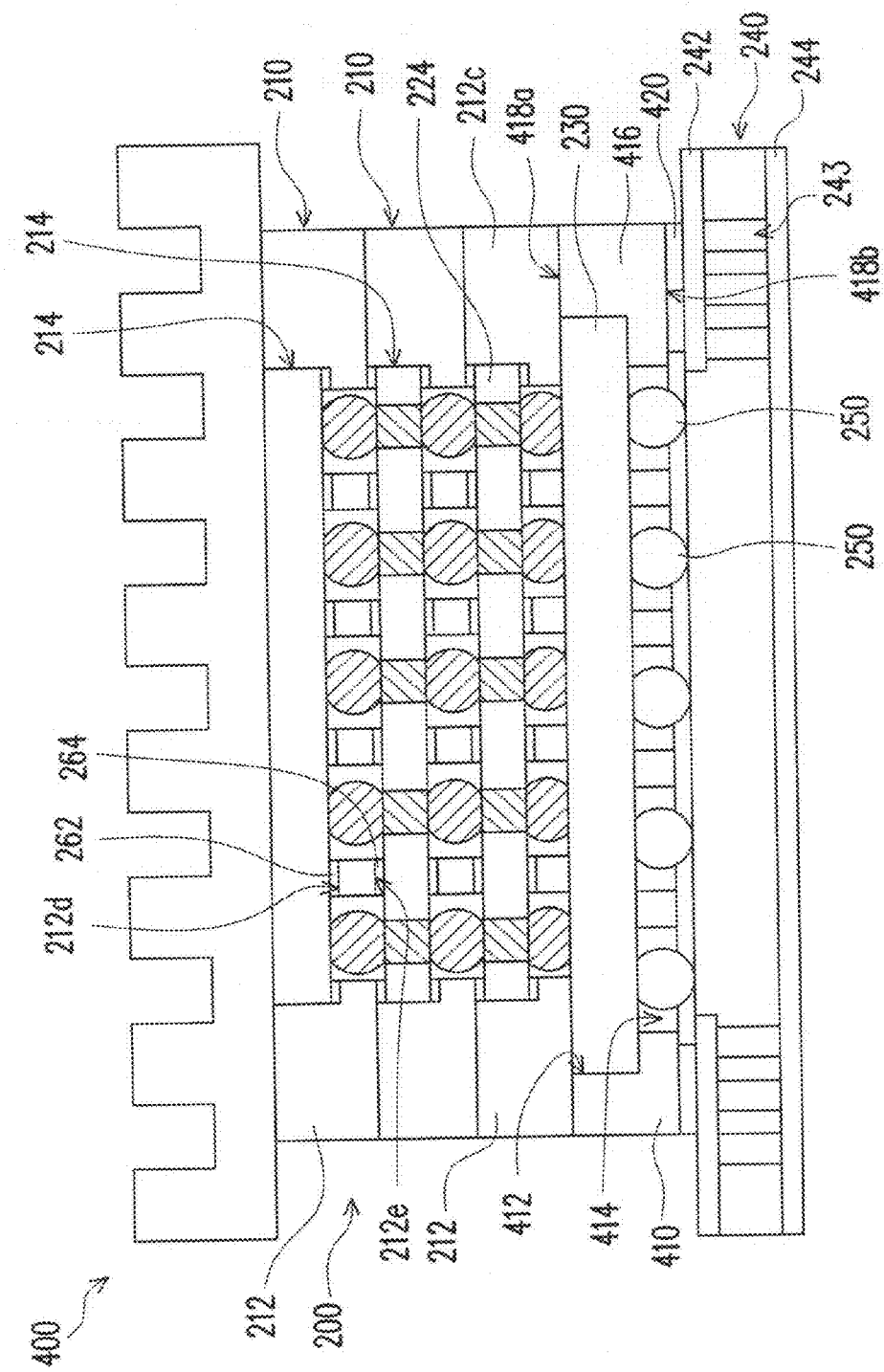
FIGS. 4 and 5 illustrate two modifications made to the stacked-chip packaging structure depicted FIG. 2A.
Figure 5:
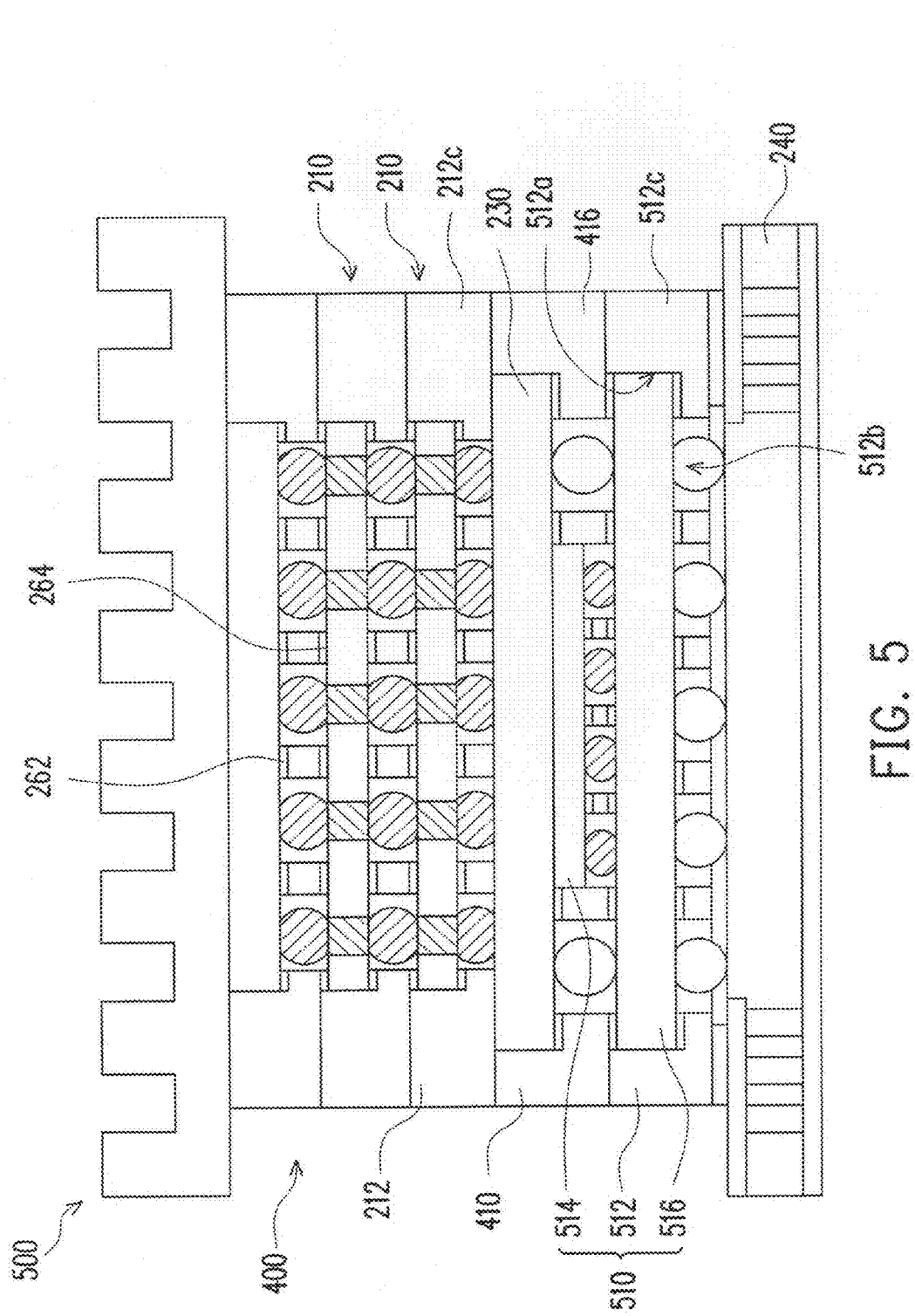

FIGS. 4 and 5 illustrate two modifications made to the stacked-chip packaging structure depicted FIG. 2A. As indicated in FIG. 4, according to the embodiment, the stacked-chip packaging structure 400 is similar to the stacked-chip packaging structure 200 shown in FIG. 2A, while the difference therebetween lies in that the stacked-chip packaging structure 400 further includes a bottom heat-dissipation structure 410 having a substrate recess 412, a plurality of openings 414 arranged in the substrate recess 412, and an edge portion 416 extending from the substrate recess 412. Likewise, the adhesion layers 262 and 264 can be respectively disposed on the two opposite surfaces 212d and 212e of the heat-dissipation structure 212, so as to bond the heat-dissipation structure 212 to two adjacent chips 214 and further enhance bonding strength between two chip sets 210 and reliability of the stacked-chip packaging structure 400.

The substrate 230 is disposed in the substrate recess 412. Each of the solder balls 250 is correspondingly disposed within one of the openings 414 of the bottom heat-dissipation structure 410. One side 418a of the bottom heat-dissipation structure 410 contacts the heat-dissipation structure 212 of the neighboring chip set 210, and the other side 418b of the bottom heat-dissipation structure 410 contacts the circuit board 240.

The edge portion 416 of the bottom heat-dissipation structure 410 contacts the extending portion 212c of the heat-dissipation structure 212 of the neighboring chip set 210. Thereby, heat generated by the chips 214 can be conducted to the substrate 230 and the circuit board 240 through the heat-dissipation structures 212 and the bottom heat-dissipation structure 410. In the embodiment, the bottom heat-dissipation structure 410 can be connected to the ground pads (or the power pads) 242 of the circuit board 240 or can be connected to the copper foil layer 244 through the through holes 243 of the circuit board 242, so as to conduct the heat generated by the chips 214 to external surroundings through the circuit board 240. Additionally, according to the embodiment, a bonding layer 420 can be disposed between the bottom heat-dissipation structure 410 and the circuit board 240, such that the bottom heat-dissipation structure 410 can be bonded onto the circuit board 240. The bonding layer 420 can be made of a material having a high conductive coefficient.

According to another embodiment as depicted in FIG. 5, the stacked-chip packaging structure 500 is similar to the stacked-chip packaging structure 400 shown in FIG. 4, while the difference therebetween lies in that the stacked-chip packaging structure 500 further includes a packaging structure 510 located between the circuit board 240 and the substrate 230. In the embodiment, the packaging structure 510 includes a first heat-dissipation structure 512, a first chip 514, and a first substrate 516. Note that the number of the first heat-dissipation structure 512 and the number of the first chip 514 can be plural according to other embodiments. The adhesion layers 262 and 264 can be respectively disposed on the two opposite surfaces 212d and 212e of the heat-dissipation structure 212, so as to bond the heat-dissipation structure 212 to two adjacent chips 214 and to further enhance bonding strength between two chip sets 210 and reliability of the stacked-chip packaging structure 500. The adhesive layer 264 is a heat-conducting adhesive or any other equivalent.

The first heat-dissipation structure 512 has a first chip recess 512a, a plurality of first through holes 512b arranged in the first chip recess 512a, and a first extending portion 512c extending from the first chip recess 512a. The first chip 514 is disposed in the first chip recess 512a. The first substrate 516 is located at a bottom portion of the first chip 514. The first extending portion 512c of the first heat-dissipation structure 512 contacts the edge portion 416 of the neighboring bottom heat-dissipation structure 410. In other embodiments, given that the stacked-chip packaging structure is not equipped with the bottom heat-dissipation structure 410, which is similar to the stacked-chip packaging structure 200, the first extending portion 512c of the first heat-dissipation structure 512 contacts the extending portion 212c of the heat-dissipation structure 212 of the neighboring chip set 210.

The chip recesses 212a in the stacked-chip packaging structures shown in FIGS. 2A, 4, and 5 have the upward design, which should not be construed as limitations to the embodiment. In other embodiments, the chip recess can have a downward design.

Figure 6:
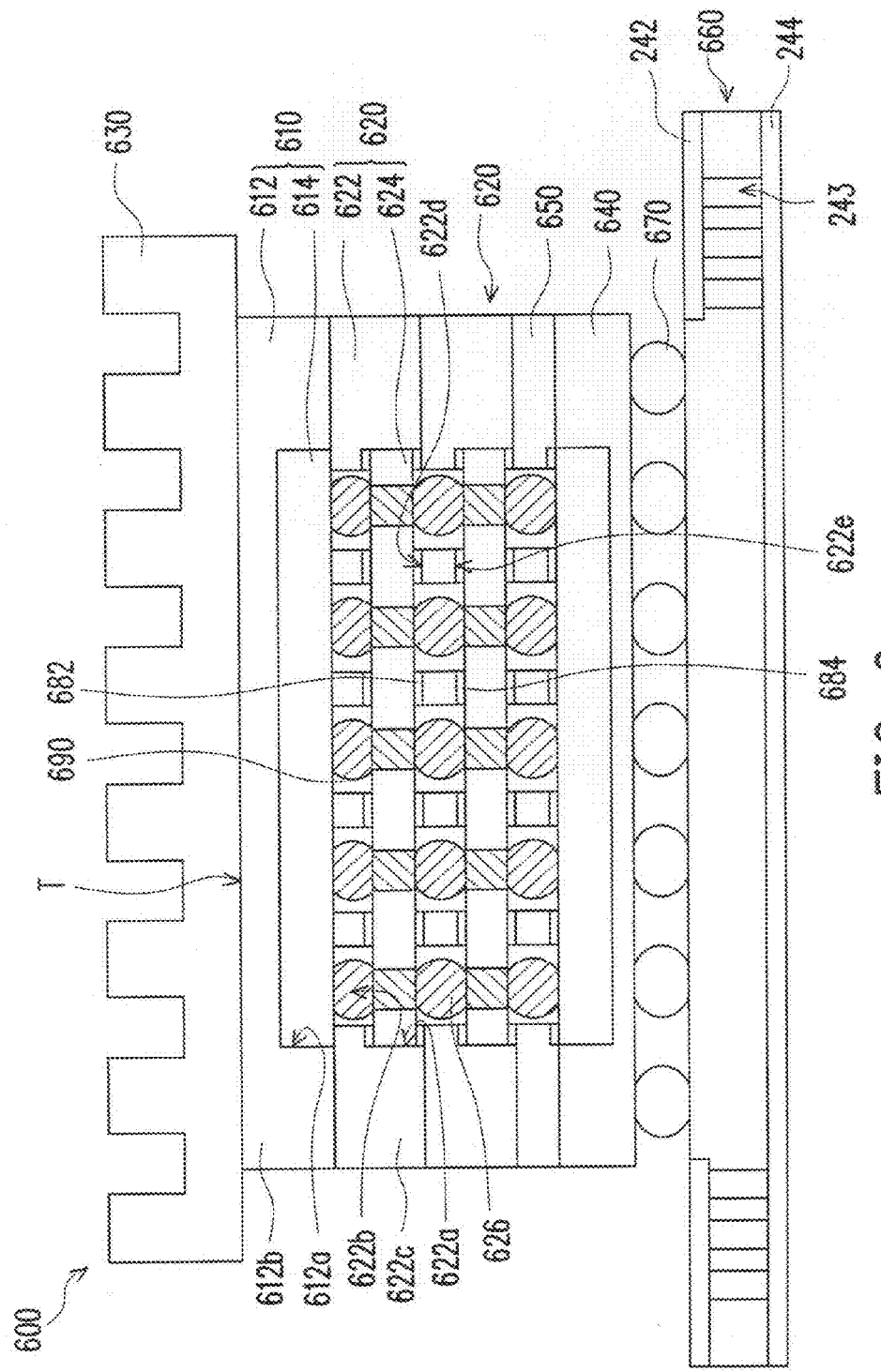
FIG. 6 is a cross-sectional view of a stacked-chip packaging structure according to an embodiment.

FIG. 6 is a cross-sectional view of a stacked-chip packaging structure according to another embodiment. As shown in FIG. 6, the stacked-chip packaging structure 600 of the embodiment includes a first chip set 610, a plurality of second chip sets 620, a heat sink 630, a substrate 640, a bottom heat-dissipation structure 650, a circuit board 660, and a plurality of solder balls 670.

The first chip set 610 includes a first heat-dissipation structure 612 and a first chip 614. The first heat-dissipation structure 612 has a first chip recess 612a and a first extending portion 612b extending from the first chip recess 612a. The first chip 614 is disposed in the first chip recess 612a.

The second chip sets 620 are disposed below the first chip set 610, and each of the chip sets 620 includes a second heat-dissipation structure 622 and a second chip 624. The second heat-dissipation structure 622 has a second chip recess 622a, a plurality of through holes 622b arranged in the second chip recess 622a, and a second extending portion 622c extending from the second chip recess 622a. The second chip 624 has a plurality of bumps 626 thereon and is disposed in the second chip recess 622a. Each of the bumps 626 on the second chip 624 is correspondingly disposed in one of the through holes 622b of the second heat-dissipation structure 622, respectively. It should be mentioned that the first and the second chip recesses 612a and 622a are downward recesses. In the embodiment, prior to stacking the first and the second chips 614 and 624, the first chip 614 and the second chip 624 are respectively disposed in the first chip recess 612a and the second chip recess 622a. After that, the first and the second heat-dissipation structures 612 and 622 respectively having the first and the second chips 614 and 624 are rotated by 180 degrees and stacked together.

The first extending portion 612b of the first heat-dissipation structure 612 contacts the second extending portion 622c of the second heat-dissipation structure 622 of the neighboring second chip set 620. According to the embodiment, for instance, the first and the second heat-dissipation structure 612 and 622 are made of a ceramic material, a metal material, or a semiconductor material. The ceramic material includes aluminum oxide, aluminum nitride, or silicon carbide. The metal material includes copper or aluminum. The semiconductor material includes silicon. Besides, the first and the second heat-dissipation structures 612 and 622 can be made of the same material or different materials.

In the embodiment, an adhesive layer 682 and an adhesive layer 684 can be respectively disposed on two opposite surfaces 622d and 622e of the second heat-dissipation structure 622, so as to bond the second heat-dissipation structure 622 to two adjacent second chips 624 or to the neighboring first chip 614 and the neighboring second chip 624. Thereby, bonding strength between the first and the second chip sets 610 and 620 and reliability of the stacked-chip packaging structure 600 can be enhanced. On the other hand, in the embodiment, a buffer material 690 can be disposed in the through holes 622b. The buffer material 690 completely fills inner walls of the through holes 622b and gaps G among the bumps 626 to reduce stresses of the bumps 626. The buffer material 690 is, for example, polymer.

The heat sink 630 is located at a top portion T of the first chip set 610. In the embodiment, the heat generated by the first chip 614 during operation can be vertically conducted to the heat sink 630 on the first chip set 610 through the first heat-dissipation structure 612. The substrate 640 is located at bottom portions B of the second chips sets 620. The bottom heat-dissipation structure 650 is located between the substrate 640 and the second chip sets 620. The circuit board 660 is located below the substrate 640. The circuit board 660 is equipped with elements which are commonly installed on a known circuit board, and the elements include ground pads (or power pads) 242, through holes 243, and a copper foil layer 244. The solder balls 670 are located between the circuit board 660 and the substrate 640.

In other embodiments, the stacked-chip packaging structure can further include another packaging structure (not shown). Similar to the packaging structure 500 depicted in FIG. 5, the packaging structure (not shown) herein is located between the circuit board 660 and the substrate 640, and the way to bond the stacked-chip packaging structure 600 and the packaging structure (not shown) is similar to that of the stacked-chip packaging structure 500 shown in FIG. 5.

FIGS. 7A-7E are cross-sectional views illustrating a process of fabricating a stacked-chip packaging structure according to an embodiment.

Figure 7A:
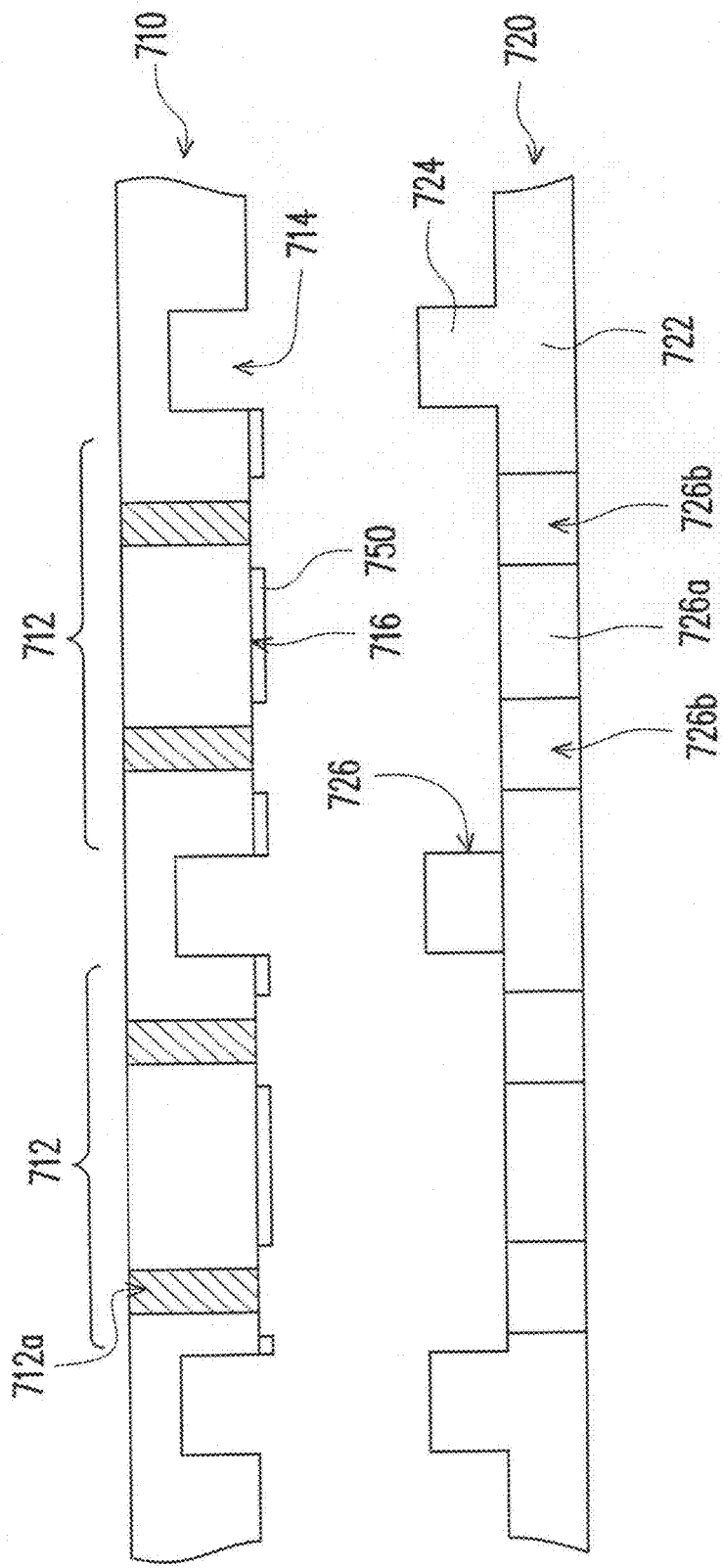

First, as indicated in FIG. 7A, a wafer 710 is provided. A plurality of chips 712 and a plurality of pre-scribed lines 714 alternately disposed are formed on the wafer 710. The chips 712 are defined by the pre-scribed lines 714. A plurality of vent holes 712a filled with conductive materials to form a plurality of conductive channels are formed in the chips 712. In the embodiment, an adhesion layer 750 can be further formed on a surface 716 of the wafer 710.

Next, referring to FIG. 7A, a heat-dissipation structure 720 is provided. The heat-dissipation structure 720 has a main body 722, a plurality of bar-shaped protrusions 724 disposed alternately, and a plurality of recesses 726. A plurality of through holes 726b are formed at bottom portions 726a of the recesses 726. The bar-shaped protrusions 724 of the heat-dissipation structure 720 correspond to the pre-scribed lines 714 on the wafer 710, and therefore patterns of the bar-shaped protrusions 724 and arrangement of the bar-shaped protrusions 724 are designed according to locations of the bar-shaped protrusions 724. The recesses 726 of the heat-dissipation structure 720 correspond to the chips 712 on the wafer 710, and therefore patterns of the recesses 726 are designed according to locations of the chips 712. The design of the through holes 726b at the bottom portions 726a of the recesses 726 is based on locations of the bumps subsequently formed on the chips 712.

After that, as indicated in FIG. 7B, a plurality of bumps A are formed on the chips 712 of the wafer 710. The heat-dissipation structure 720 and the wafer 710 are then assembled together, such that the bar-shaped protrusions 724 of the heat-dissipation structure 720 are disposed in the pre-scribed lines 714 on the wafer 710. Each of the chips 712 is correspondingly disposed in one of the recesses 726 of the heat-dissipation structure 720, and the bumps A on the chips 712 are inserted into the through holes 726b of the heat-dissipation structure 720. In the embodiment, the gap between the inner walls of the through holes 726b and the bumps A can also be selectively filled with a buffer material 760.

Thereafter, as shown in FIG. 7C, a polishing process is performed on the wafer 710 to expose the bar-shaped protrusions 724 of the heat-dissipation structure 720. The polishing process is performed on a surface 718 (a back surface) of the wafer 710 to reduce the thickness of the wafer 710 until the bar-shaped protrusions 724 are exposed. The surface 718 is opposite to a surface 716.

Figure 7D:
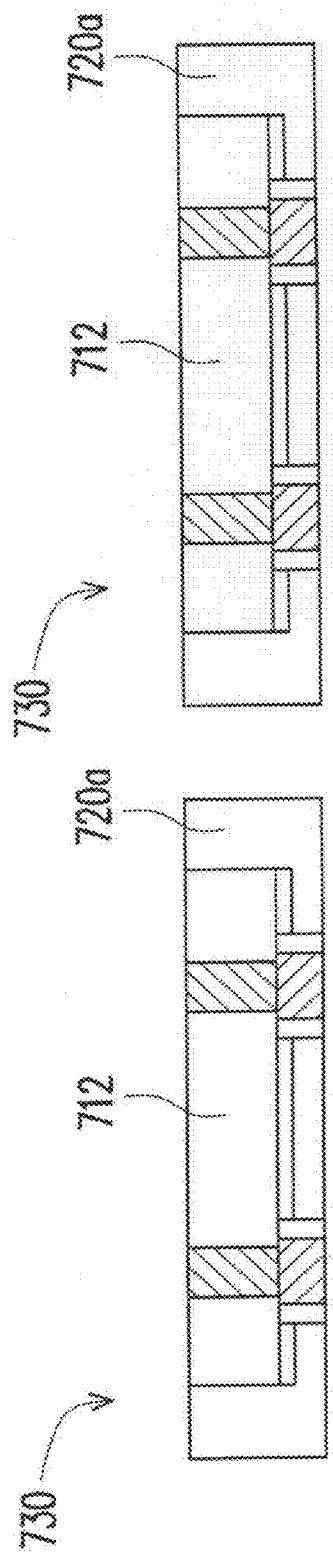
Figure 7E:
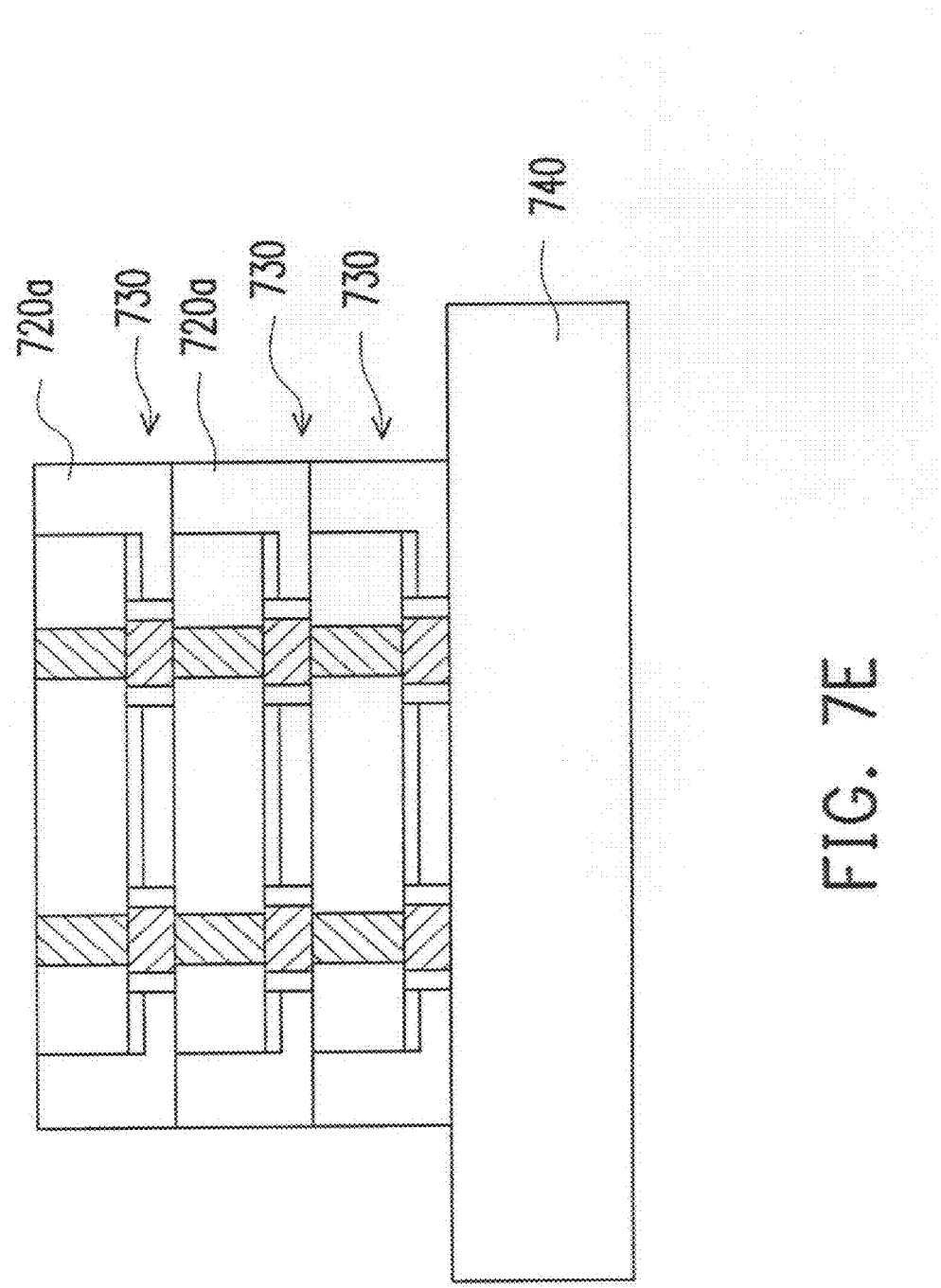

As indicated in FIG. 7D, a cutting process is then performed along the pre-scribed lines 714 to form a plurality of chip sets 730. During implementation of the cutting process, the bar-shaped protrusions 724 located in the pre-scribed lines 714 are cut, such that the heat-dissipation structure 720 is divided into a plurality of heat-dissipation units 720a, each of which is disposed in one of the chip sets 730. Next, as shown in FIG. 7E, the chip sets 730 are stacked together, and the heat-dissipation units 720a of the neighboring chip sets 730 are contacted to each other. Thereafter, the stacked chip sets 730 are disposed on a substrate 740. A heat sink can be formed on the uppermost chip set 730 (as shown in FIG. 2A), and elements including solder balls and a circuit board can be disposed below the substrate 740 (as shown in FIG. 2A).

In light of the foregoing, the heat-dissipation structure of the embodiment has heat-conducting structures located among the chips and an extending portion located around the chips. Therefore, the stacked-chip packaging structure is equipped with plural channels for dissipating heat. Thereby, heat generated by the chips can be laterally and vertically conducted through the heat-conducting structures among the chips and the extending portion around the chips. As such, the heat generated by the chips can be effectively diffused by the heat-dissipation structure and conducted to the heat sink above the chip sets and the substrate below the chip sets. Furthermore, the heat can even be conducted to the circuit board below the substrate. So, formation of hot spots on the chips can be effectively prevented.

Although the embodiment has been described with reference to the above embodiments, it will be apparent to one of the ordinary skill in the art that modifications to the described embodiment may be made without departing from the spirit of the embodiment. Accordingly, the scope of the embodiment will be defined by the attached claims not by the above detailed descriptions.

What is claimed is:

1. A stacked-chip packaging structure, comprising:
    a plurality of chip sets stacked together, each of the chip sets comprising:
    a heat-dissipation structure comprising an interlayer portion, an extending portion extending from two ends of the interlayer portion, a chip recess formed between the interlayer portion and the extending portion, and a plurality of through holes arranged in the interlayer portion, wherein the through holes pass through the interlayer portion;
    a chip, disposed on the interlayer portion and disposed in the chip recess, wherein a plurality of bumps are disposed in the through holes of the heat-dissipation structure respectively, and a buffer material is filled in the through holes and filled between the interlayer portion and the bump; and
    wherein the extending portion of the heat-dissipation structure of each of the chip sets contacts the extending portion of the heat-dissipation structure of the neighboring chip set;
    a heat sink located at a top portion of the chip sets;
    a substrate located at a bottom portion of the chip sets;
    a circuit board located below the substrate; and
    a plurality of solder balls located between the circuit board and the substrate.

2. The stacked-chip packaging structure as claimed in claim 1, further comprising:
    a bottom heat-dissipation structure comprising a bottom interlayer portion, an edge portion extending from two ends of the bottom interlayer portion, a substrate recess formed between the bottom interlayer portion and the edge portion, and a plurality of openings arranged in the bottom interlayer portion,
    wherein the substrate is disposed on the bottom interlayer portion and disposed in the substrate recess, the solder balls are disposed in the openings of the bottom heat-dissipation structure respectively, the edge portion at one side of the bottom heat-dissipation structure contacts the extending portion of the heat-dissipation structure of the neighboring chip set, and the other side of the bottom heat-dissipation structure contacts the circuit board.

3. The stacked-chip packaging structure as claimed in claim 2, further comprising a bonding layer located between the edge portion of the bottom heat-dissipation structure and the circuit board so as to bond the bottom heat-dissipation structure on the circuit board.

4. The stacked-chip packaging structure as claimed in claim 2, further comprising another packaging structure located between the circuit board and the substrate disposed in the substrate recess of the bottom heat-dissipation structure.

5. The stacked-chip packaging structure as claimed in claim 4, wherein the another packaging structure comprises:
   at least one first heat-dissipation structure comprising a first interlayer portion, a first extending portion extending from two ends of the first interlayer portion, a first chip recess formed between the first interlayer portion and the first extending portion, and a plurality of first through holes arranged in the first interlayer portion, wherein the first through holes pass through the first interlayer portion;
   at least one first chip disposed on the first interlayer portion and disposed in the first chip recess; and
   a first substrate located at a bottom portion of the at least one first chip,
   wherein the first extending portion of the at least one first heat-dissipation structure contacts the extending portion of the heat-dissipation structure of the neighboring chip set.

6. The stacked-chip packaging structure as claimed in claim 1, wherein the buffer material comprises polymer.

7. The stacked-chip packaging structure as claimed in claim 1, wherein a material of the heat-dissipation structure comprises a ceramic material, a metal material, or a semiconductor material, the ceramic material includes aluminum oxide or aluminum nitride, the metal material includes copper or aluminum, and the semiconductor material includes silicon.

8. The stacked-chip packaging structure as claimed in claim 1, wherein each of the chip sets further comprises at least one adhesion layer located on an upper surface of the interlayer portion of the heat-dissipation structure, a lower surface of the interlayer portion of the heat-dissipation structure, a surface of the extending portion, or a combination thereof.

9. The stacked-chip packaging structure as claimed in claim 1, wherein the chip of each chip set comprises a plurality of vent holes filled with conductive materials so as to form a plurality of conductive channels, and the conductive channels are electrically connected to the chip of the neighboring chip set through the bumps.

* * * * *